United States Patent
Alfrey

(10) Patent No.: US 7,756,173 B2
(45) Date of Patent: Jul. 13, 2010

(54) LASER DIODE DRIVER WITH ADAPTIVE COMPLIANCE VOLTAGE

(76) Inventor: Anthony J. Alfrey, 100 Redwood Ter., Woodside, CA (US) 94062

(*) Notice: Subject to any disclaimer, the term of this patent is extended or adjusted under 35 U.S.C. 154(b) by 34 days.

(21) Appl. No.: 12/143,438

(22) Filed: Jun. 20, 2008

(65) Prior Publication Data
US 2009/0316743 A1 Dec. 24, 2009

(51) Int. Cl.
*H01S 5/062* (2006.01)
(52) U.S. Cl. .............. 372/38.07; 372/38.01; 372/38.02; 372/38.04; 372/38.08
(58) Field of Classification Search .............. 372/38.08, 372/38.01, 38.02, 38.07, 38.04
See application file for complete search history.

(56) References Cited

U.S. PATENT DOCUMENTS

| 4,305,047 | A   |   | 12/1981 | Chapman et al. |           |
|-----------|-----|---|---------|----------------|-----------|
| 4,577,320 | A   | * | 3/1986  | Yoshikawa et al. | 372/29.012 |
| 4,656,637 | A   | * | 4/1987  | McCormick      | 372/38.04 |
| 5,473,623 | A   |   | 12/1995 | Fahey et al.   |           |
| 5,515,392 | A   |   | 5/1996  | Teremy         |           |
| 5,629,542 | A   | * | 5/1997  | Sakamoto et al. | 257/328  |
| 5,748,657 | A   |   | 5/1998  | Gaddis         |           |
| 6,097,159 | A   |   | 8/2000  | Mogi et al.    |           |
| 6,816,535 | B2  | * | 11/2004 | Ho et al.      | 372/107   |
| 6,879,608 | B1  |   | 4/2005  | Schuelke et al. |          |
| 7,541,785 | B2  | * | 6/2009  | Murakami       | 323/222   |
| 2007/0127344 | A1 | * | 6/2007 | Mizuno et al.  | 369/59.12 |
| 2007/0280315 | A1 | * | 12/2007 | Mizuno        | 372/38.02 |
| 2009/0219964 | A1 | * | 9/2009 | Yossi et al.   | 372/38.02 |

OTHER PUBLICATIONS

Simons, U.S. Statutory Invention Registration H322, Published Aug. 4, 1987.
SDL, Inc., Model SDL-830 Schematic Diagrams 11.1-11.4, 1992.

* cited by examiner

*Primary Examiner*—Minsun Harvey
*Assistant Examiner*—Michael Carter
(74) *Attorney, Agent, or Firm*—Vierra Magen Marcus & DeNiro LLP

(57) ABSTRACT

A laser diode driver with means for adjusting the compliance voltage to allow a current source to accurately reproduce a current command while simultaneously minimizing the power dissipation of the current source. For a slowly-varying or DC current command, the compliance voltage is continuously adjusted to limit the power dissipation of the current source to below a predetermined minimum. For a pulsed current waveform, the compliance voltage is maximized during periods of zero or low current demand so that sufficient energy is stored to faithfully reproduce the leading edge of a pulsed current command, and reduced during the plateau portion of a pulsed current command to minimize the power dissipation of the current source.

20 Claims, 7 Drawing Sheets

LASER DIODE DRIVER WITH ADAPTIVE COMPLIANCE VOLTAGE

BACKGROUND

Description of Related Art

Laser diodes behave electrically like conventional semiconductor diodes: in response to current flow above some minimum value, the diode appears electrically equivalent to a fixed voltage drop in series with a small resistance.

FIG. 1 displays typical current versus voltage drop dependence for a high current laser diode. Above a small current, the voltage drop 1 across the diode is nearly constant and increases slowly with current. As a result, a common technique in the prior art to supplying current to a laser diode is to use a power supply with an output voltage, often referred to as the compliance voltage, that is manually adjusted, followed by a noise filter and controlled current source. During the operation of the laser diode over a range of currents, the compliance voltage is held fixed. To accommodate a broad range of operating conditions, including pulsed current operation with fast current rise times, the compliance voltage is adjusted to a high value substantially greater than the maximum forward voltage drop of the laser diode to insure that the controlled current source may accurately respond to a current command. For high-power laser diodes operating at currents of over 10 amps, this may result in substantial power dissipation within the current source, requiring large heat sinks and cooling provisions for the controlled current source.

SUMMARY

Herein is described an apparatus for adjusting the compliance voltage of a laser diode driver. The driver comprises an adjustable voltage power supply, a noise filter and a controlled current source, in which it is desired to minimize the power dissipation in the controlled current source. When the driver is used to provide a pulsed current to the laser diode, at the beginning of the current pulse, the compliance voltage is set to an elevated first predetermined value such that energy is stored in the noise filter sufficient to supply current to the laser diode for a period approximately equal to the noise filter time constant. After said period, as the noise filter current reaches a value equal to the plateau current of the current pulse, the compliance voltage is decreased to a second predetermined value to minimize the power dissipation of the current controlling element within a current source. By providing such an adjustable compliance voltage, the diode driver may meet both constant and pulsed current demands of the user while minimizing the power dissipated in the current controlling element comprising the current source.

The selection of the compliance voltage during the plateau portion of a diode current pulse is achieved by measuring and limiting the power dissipated in the controlled current source to a predetermined maximum value.

For applications in which the diode current is slowly-varying or nearly constant, the power dissipation of the current controlling element is minimized while simultaneously maintaining a sufficient voltage drop across the current controlling element to retain a linear response to a controlling voltage. Automatic adjustment of the compliance voltage for both slowly-varying and pulsed currents is provided.

Other aspects and advantages of the present technology can be seen on review of the drawings, the detailed description and the claims, which follow.

DETAILED DESCRIPTION

A detailed description of embodiments of the present technology is provided with reference to FIGS. 2 through 8.

The present technology provides laser diode drive circuitry to adjust the compliance voltage of a power supply so as to minimize the power dissipated by the controlled current source contained within said drive circuitry yet also provide a sufficient zero-current compliance voltage for linear operation of the controlled current source, especially during conditions of rapid current rise. The technology provides methods for reducing power dissipation, thereby allowing a more compact device to be assembled for driving laser diodes, while at the same time insuring accurate reproduction of a desired current pulse.

Figure 2:
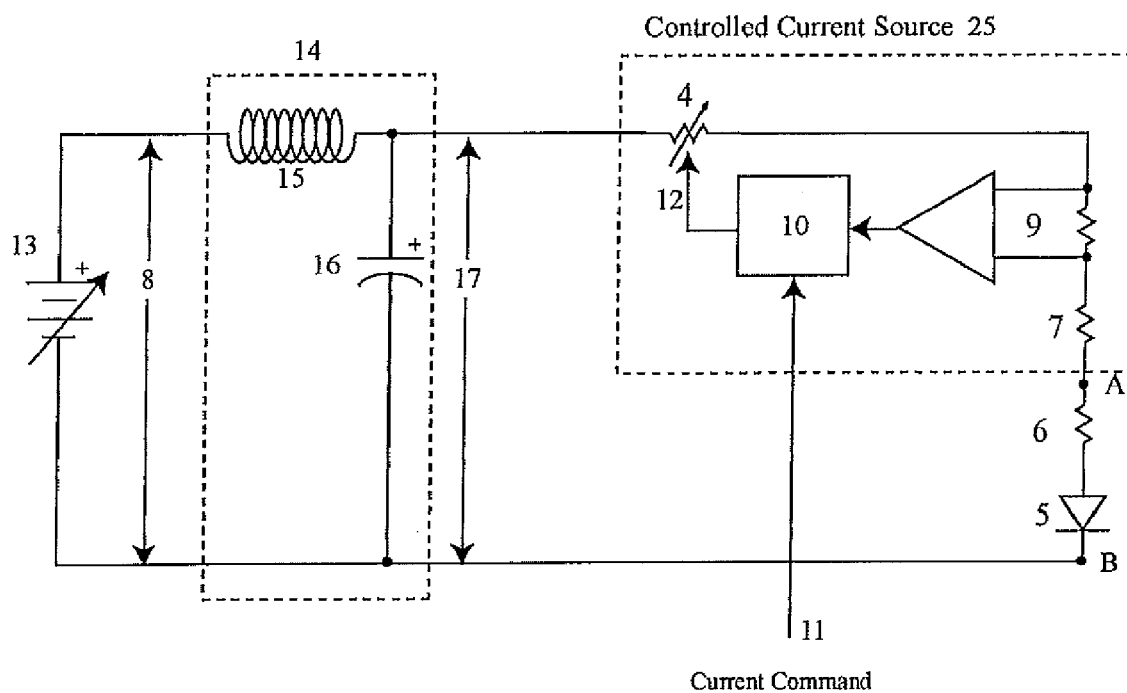
FIG. 2 is a schematic diagram of a prior art laser diode driver incorporating a controlled voltage power supply, a filter and an adjustable resistive current-controlling element.

FIG. 2 shows a diode driver consisting of a source 13 of adjustable DC voltage 8, followed by a noise filter 14 and a voltage-controlled current source 25, comprising an adjustable resistive element 4 placed in series with the laser diode 5. The resistive element 4 may comprise a multiplicity of MOSFETs wired in parallel in such a way so as to distribute the diode current through several MOSFETs, thereby decreasing the power dissipation of an individual MOSFET. The current source 25 is controlled by first monitoring the current through the laser diode 5 by using a current sense resistor and amplifier 9. Following said amplifier is a control circuit 10 which compares the measured current signal with a current command voltage 11 corresponding to the desired current, and which provides a control signal 12 to the adjustable resistive element 4.

The voltage 8 may be considered the "zero-current compliance voltage" which is the maximum output voltage that is available from the current source 25 under conditions of minimal output current from the current source. The various resistive elements between the DC source 13 and laser diode 5 (the MOSFETs 4, the dynamic resistance 6 of the laser diode and the resistance 7 represented by the interconnections and conductors between the DC source 3 and the laser diode 5) represent voltage drops that must be added to that of the laser diode itself. The zero-current compliance voltage 8 is equal to this sum.

The voltage drop across the MOSFETs must be sufficient so that the MOSFETs operate approximately in a linear manner, that is, that the current through the MOSFETs 4 is a linear function of the controlling voltage 12. The zero-current compliance voltage is somewhat different than a traditional definition of the compliance voltage, i.e. the maximum possible output voltage between points A and B of FIG. 2 when the current source is connected to a load and when the current source provides a regulated current up to a maximum specified current. This distinction is important because the so-called compliance voltage that is often user-adjustable in a commercial laser diode power supply is actually the zero-current compliance voltage, and not the traditional definition of compliance voltage.

Because the dynamic resistance of a laser diode is small, the zero-current compliance voltage 8 can be set to be only slightly larger than the forward voltage drop of the laser diode. For example, consider a typical large laser diode, capable of an optical output of 40 watts, with a forward voltage drop of 1.6 volts and a dynamic resistance of 4 milliohms, requiring a current of 55 amps to achieve this output. Typically, there may be 5 milliohms of resistance, represented by the sum of item 7, the resistance of various electrical connections between the current source and the laser diode, and the effective resistance of the noise filter. Therefore, at a current of 55 amps, there may be a total voltage drop of 0.5 volts across this total resistance. Additionally, there will be some minimum resistance associated with the adjustable resistive element 4 used as a current control element, which may be approximately 4 milliohms, accounting for an additional voltage drop of 0.22 volts. Therefore, these voltage drops must be added to the 1.6 volts of forward voltage drop across the laser diode, resulting in a required compliance voltage of 2.32 volts.

While the zero-current compliance voltage 8 must be sufficient to sustain the linear operation of the MOSFETs, it is also important to set the compliance voltage to be as small as possible, because the MOSFETs 4 may otherwise dissipate considerable power. An expression for the power dissipated by the MOSFETs is given by $$P = I(Vc - Vf) - I^2(Rs + Rd)$$

where I is the diode current, Vf is the forward voltage drop of the diode, Vc is the compliance voltage, Rd is the dynamic resistance 6 of the laser diode and Rs is the total series resistance 7 due to other components. For the situation in which the compliance voltage Vc is 2.32 volts but the desired current through the diode is 25 amps, the power dissipation in the MOSFETs is 12.4 watts and must be dissipated by a heat sink to prevent excessive temperature rise that might otherwise damage the MOSFETs. However, because of the low dynamic resistance of a laser diode, there will be only a small change in the voltage drop across the MOSFETs 4 as the diode current is changed, therefore the zero-current compliance voltage Vc may be set to a value that is only slightly larger than the forward voltage drop of the laser diode, thereby minimizing the power dissipation in the MOSFETs.

In conventional diode supply systems, the compliance voltage is often set manually by the user. Because a manual selection of the zero-current compliance voltage to an elevated level may result in substantial power dissipation in the MOSFETs, such an embodiment will require the selection of MOSFETs and heat sinking adequate to dissipate the power deposited in the MOSFETs.

Another consideration is that low optical noise output from the laser diode can only be obtained when the noise output of the power supply 13 is adequately filtered. Therefore, the noise filter 14 may have associated with it a large time constant; that is, a large time required for the filter output voltage 17 to return to an original value after an abrupt change in diode current. Rapid changes in current caused by a pulsed current command 11 to the control circuit 10, will cause the filter output voltage to drop instead of providing a constant output voltage. For example, consider a noise filter consisting of a 10 uH inductor 15, followed by a capacitance 16 of 34,000 microfarads. This noise filter will have a time constant of approximately 2 milliseconds and will require approximately this same time for the power supply 13 to recharge the filter after the beginning of a large current pulse. Meanwhile, the output voltage 17 provided by the noise filter 14 will drop in the intervening time which will, in turn, cause a distortion in the desired current pulse through the laser diode.

Figure 3:
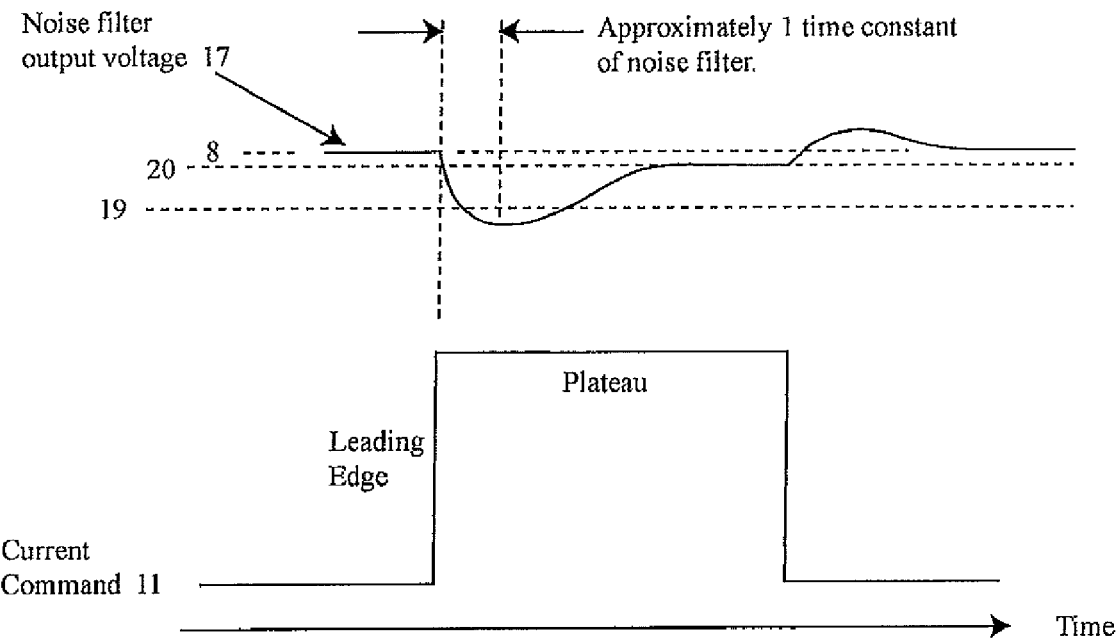
FIG. 3 is a graph depicting the voltage at the output of a noise filter during the evolution of a diode current pulse when the zero-current compliance voltage is held fixed.

FIG. 3 shows the time-dependence of the current command 11, the resulting output voltage 17 of the noise filter when this diode current flows, and the minimum required filter output voltage 19 needed to achieve the commanded current. In spite of a constant voltage 8 provided by the power supply, the output voltage 17 of the noise filter is reduced as current is drawn from the filter and a finite time is required to increase the current flow through the filter. At a time prior to the beginning of the current pulse, the output voltage at the noise filter is equal to the zero-current compliance voltage 8, since no current flows through any component. At a time equal to and slightly past the beginning of the current pulse, the filter output voltage 17 begins to fall as the noise filter discharges into the laser diode, and current from the power supply begins to increase through the noise filter. Eventually, the filter output voltage 17 may fall below the minimum voltage 19 required to maintain linear operation of the current source, at which point it is not possible to maintain the fidelity of the current command. After a period of time roughly equal to the filter time constant, the noise filter will begin to recharge to a voltage 20 slightly below the zero-current compliance voltage 8 because of the finite resistance of the noise filter. In the prior art, the zero-current compliance voltage 8 was adjusted to an elevated value while monitoring the fidelity of the current through the diode in pulsed operation. But this elevated zero-current compliance voltage then causes excessive power dissipation in the MOSFET array during the plateau portion of the pulse. So it is desirable to provide an automatic method of increasing the zero-current compliance voltage at the beginning of a current pulse to compensate for the time constant of the noise filter while subsequently reducing the zero-current compliance voltage during the plateau portion of the current pulse so as to minimize the average power dissipation of the MOSFET array.

The inductive reactance of the wiring connections and components between the noise filter 14 and the laser diode will require a further increase in the zero-current compliance voltage 8. This reactance may be incorporated into the complex impedance formerly represented by the simple resistance 7. As is well known from Faraday's Law, a time-varying diode current dI/dT will require an additional amount of zero-current compliance voltage $E = dI/dT \times L$ where L is the inductance sum of all of the electrical components in series with the laser diode. While this contribution is most severe with pulsed current waveforms of the kind shown in FIG. 3, smaller high-bandwidth current variations imposed onto a DC diode current will also require additional zero-current compliance voltage.

The technology provides a method and apparatus for adjusting the zero-current compliance voltage 8 to simultaneously minimize the power dissipation in the MOSFETs 4, yet retain a sufficient forward voltage drop across the MOSFETs to maintain linear operation when the diode current is slowly varying or nearly constant. In one embodiment, the method is automated.

Figure 1:
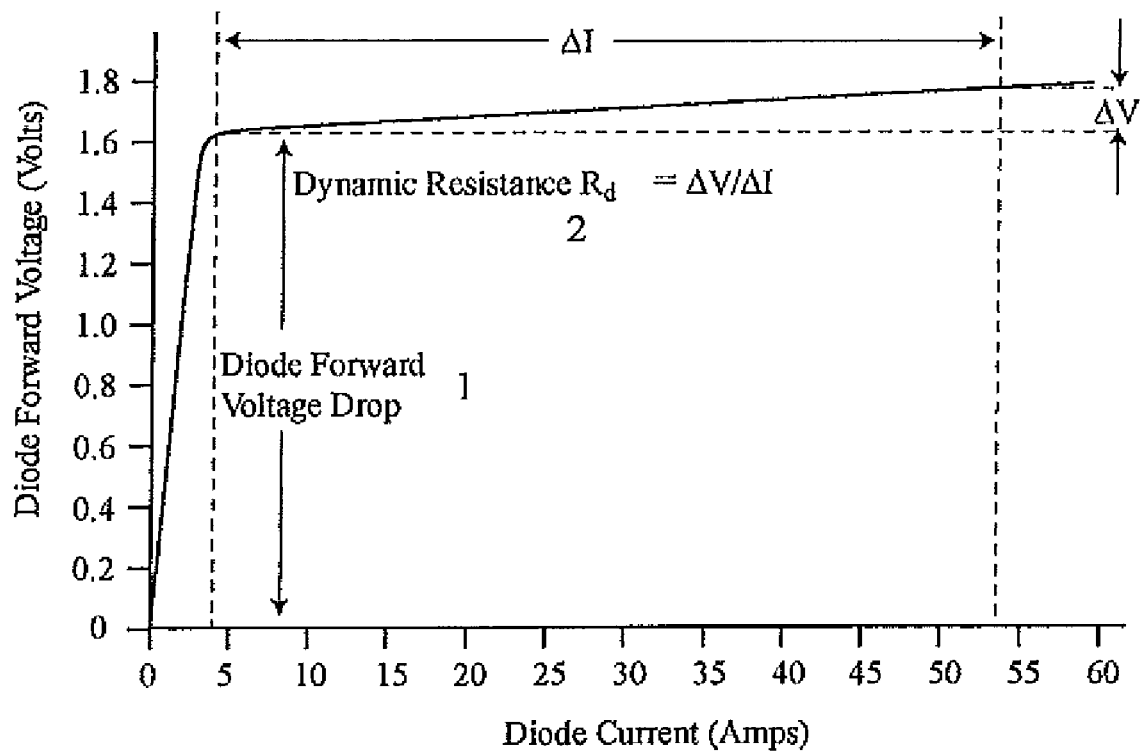
FIG. 1 is a graph depicting the current versus voltage characteristic of a laser diode.
Figure 4:
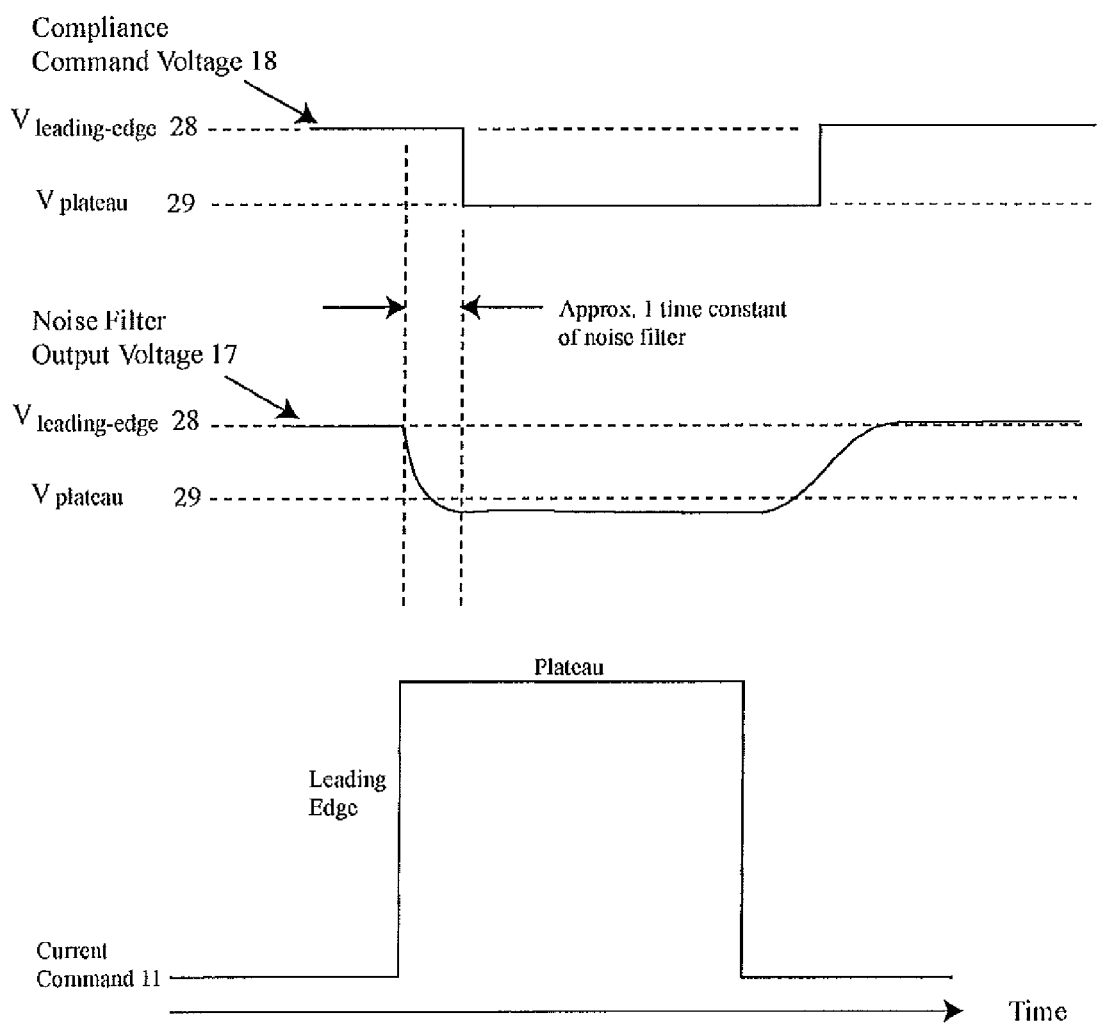
FIG. 4 is a graph depicting the voltage at the output of a noise filter when the zero-current compliance voltage is adjusted to reduce the MOSFET power consumption during the plateau of the current pulse.
Figure 5:
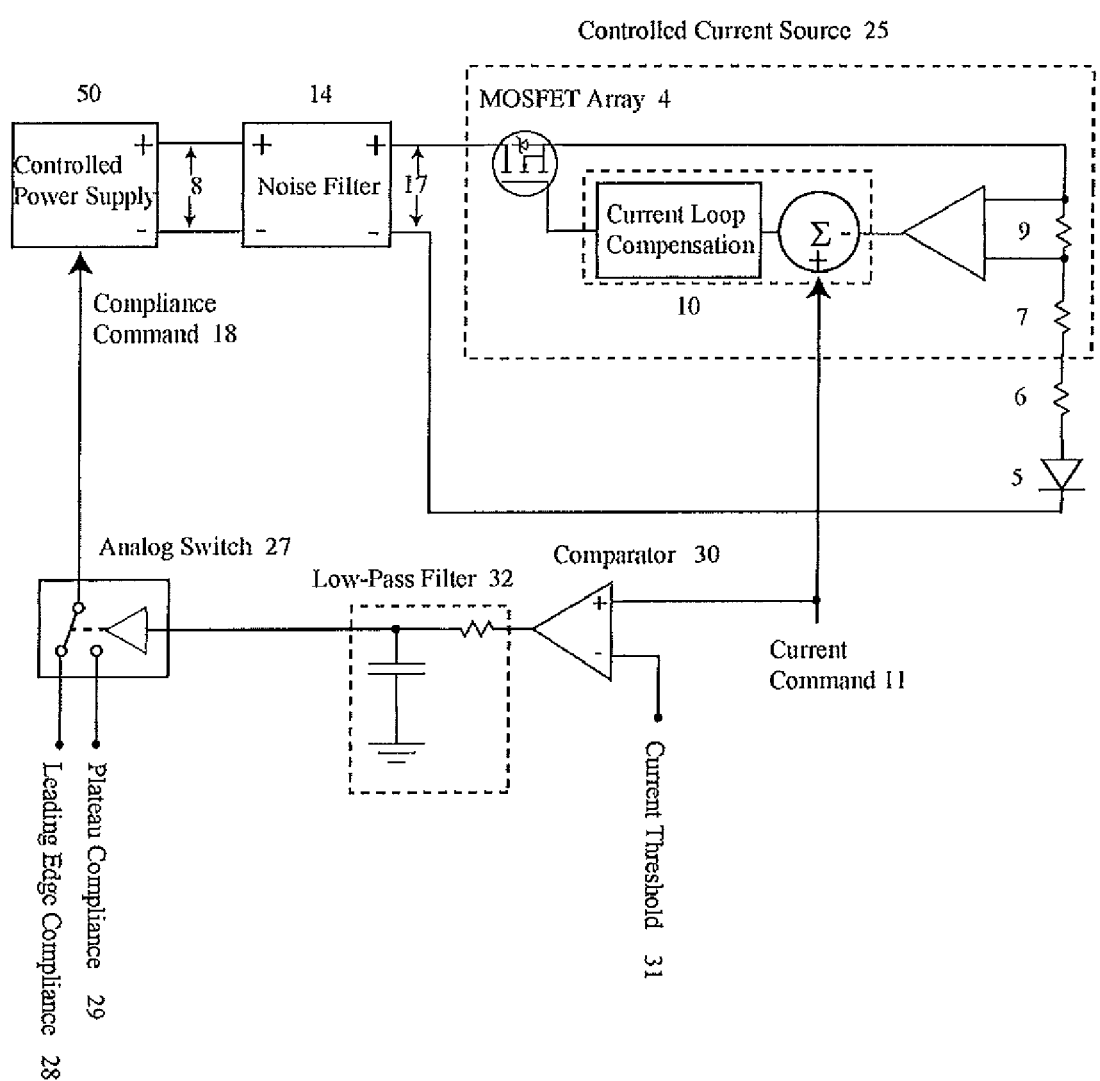
FIG. 5 is a schematic diagram of a first embodiment of an apparatus for implementing the present technology.

The method and apparatus are described with respect to FIGS. 4 and 5. FIG. 4 is a timing diagram representing the compliance command voltage and the noise filter output voltage as a function of the current command 11. As shown in FIG. 5, one embodiment of the present apparatus comprises a power supply 50 with an output voltage responsive to a command voltage 18, a noise filter 14, a controlled current source 25 comprising a MOSET or similar adjustable resistive element 4, a diode current monitor 9, a command current input 11 and current loop compensation circuitry 10 to enable the diode current to follow the input current command, a laser diode as described in FIG. 1 comprised of the electrical equivalent of an idealized diode 5 in series with dynamic resistance 6. Further, the apparatus includes a comparator 30, a low pass filter 32 and an analog switch 27 for selecting two possible compliance command voltages, one voltage 28 corresponding to the current pulse leading edge, and another voltage 29 corresponding to the current pulse plateau. As the current command 11 increases over a predetermined threshold 31, a comparator 30 is switched to an on state. The output voltage of the comparator 30 is delayed by a time approximately equal to the time constant of the low-pass filter 32, said time constant being selected to be approximately equal to the time constant of the noise filter 14. After a length of time equal to the time constant of the low pass filter 32, the compliance command voltage 18 is switched from the leading edge voltage 28 to the plateau voltage 29 by means of the analog switch 27. The MOSFET power dissipation is thereby reduced after the current through the noise filter 14 has increased to a level sufficient to supply the required diode current. As shown in FIG. 4, the filter output voltage 17 during the latter plateau portion of the current command pulse will then be slightly lower than the $V_{plateau}$, the power supply command voltage for the plateau portion of the pulse, because of the voltage drop due to the resistance of the noise filter.

The switching of the power supply command voltage from the value $V_{leading}$ edge 28 to the value $V_{plateau}$ 29 is made at a time that provides the best combination of accurate reproduction of the command current waveform and minimum power dissipation of the current source, and will be approximately equal to the time constant of the noise filter. The switching may be made at a somewhat earlier time, possibly resulting in an inaccurate reproduction of the desired current through the laser diode, or it may be made at a somewhat later time, resulting in a power dissipation in the controlled current source that is excessive for the task of an accurate reproduction of the current command through the diode. Therefore, the correct selection of the switching time will depend on the particular characteristics of the noise filter. Those skilled in the art will recognize the objective of the apparatus is to both minimize the power dissipation of the controlled current source while providing an accurate reproduction of the current command, so a range of the switching time between the value $V_{leading}$ edge 28 to the value $V_{plateau}$ 29 which we nominally refer to as the filter time constant, is included within the spirit of this technology.

In the case of DC currents above the threshold current, the zero-current compliance voltage is then reduced to a value that minimizes the power dissipation in the MOSFET array. If the user then demands large swings in that nominally DC current, there will be insufficient zero-current compliance voltage to accommodate the large back-EMF implied by Faraday's Law. Therefore, once the command current has exceeded the threshold above which the compliance voltage is reduced to minimize the power dissipation, the subsequent current command swings (on top of an otherwise DC current) must be considerably reduced. A nominal value of AC amplitude equal to 20% of the DC current command is reasonable. The value may be precisely determined by monitoring the actual response of the diode current to the commanded current to insure an accurate reproduction of the command current waveform consisting of a DC component and additional small AC component (a 'modulation' of an otherwise DC current).

In the embodiment described in FIG. 5, the appropriate selection of $V_{leading}$ edge 28 and $V_{plateau}$ 29 are selected by the user; their correct values being determined by monitoring the actual diode current in response to a pulsed command current and adjusting voltages 28 and 29 to achieve an accurate reproduction of the pulsed command current.

Figure 6:
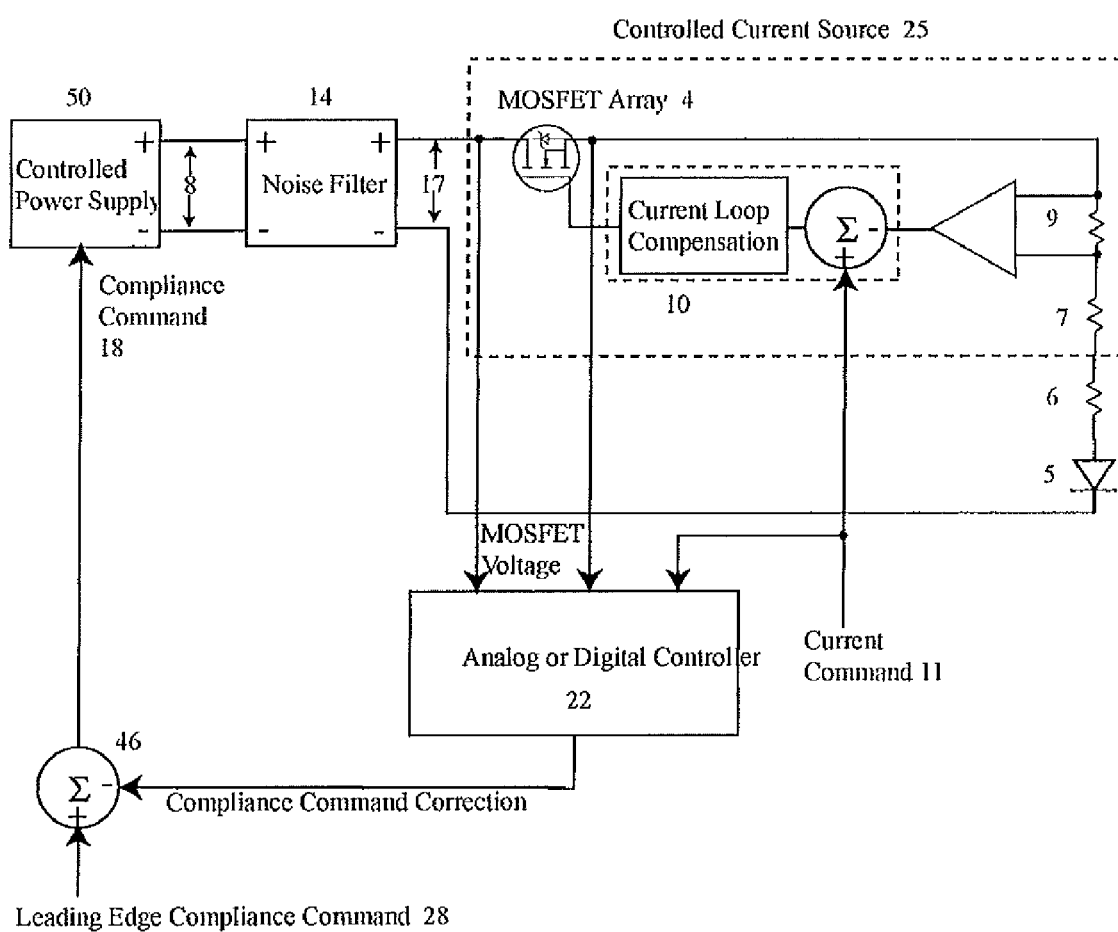
FIG. 6 is a schematic diagram of a second embodiment of an apparatus for implementing the present technology.

In another embodiment shown in FIG. 6, an apparatus is described in which the selection of the appropriate value of the zero-current compliance voltage 8, during the plateau section of the pulse, is automated. Control circuitry, which may be analog or microprocessor-based, monitors the diode current and MOSFET voltage drop, and adjusts the zero-current compliance voltage 8 during the plateau portion of the current pulse so as to control and reduce the power dissipation of the MOSFET passbank to a value not to exceed a predetermined value. The control circuitry receives the diode current and MOSFET voltage drop signals from various portions of the circuit, calculates the power dissipated by the MOSFET passbank and generates a control signal that is directed to the summing amplifier 46 so as to reduce the compliance command voltage 18, either during the current pulse plateau for a pulsed current waveform or continuously for a constant or slowly-varying current command, and thereby reduces the power dissipation of the MOSFET passbank.

Figure 7:
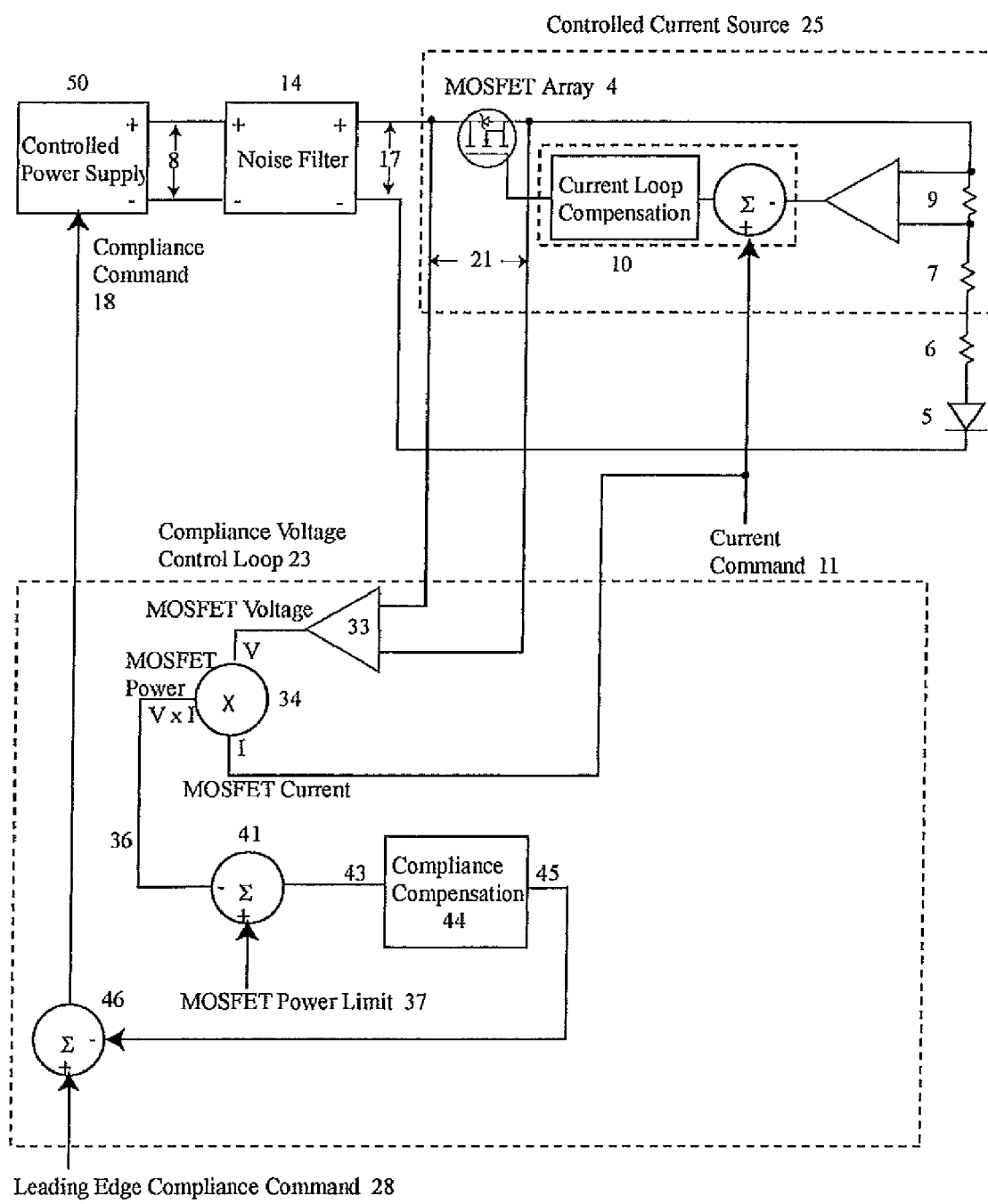
FIG. 7 is a schematic diagram of a third embodiment of an apparatus for implementing the present technology.

FIG. 7 describes another embodiment of the aforementioned automated zero-current compliance voltage adjustment for the case of a constant or slowly-varying current command. It comprises a voltage controlled current source 25 as described in FIG. 5, and a compliance voltage control loop 23. The compliance voltage control loop contains a differential amplifier 33 and a voltage multiplier 34. A voltage output 36, representing the power dissipation of the MOSFET, from the multiplier 34 is compared with a voltage 37 corresponding to the maximum allowed MOSFET Power Limit at a difference amplifier 41 which derives a voltage 43 corresponding to the difference between the actual and maximum MOSFET Power Limit. An appropriate compensation circuit 44, preferably a proportional-integral controller well-known in the art, provides an error correction voltage 45 to a summing amplifier 46, adding the error correction voltage to the compliance command voltage 28, thereby generating a corrected command compliance voltage 18, so as to limit the average MOSFET passbank power dissipation to below said limit 37, even if the command current varies slowly over a wide range of currents.

Figure 8:
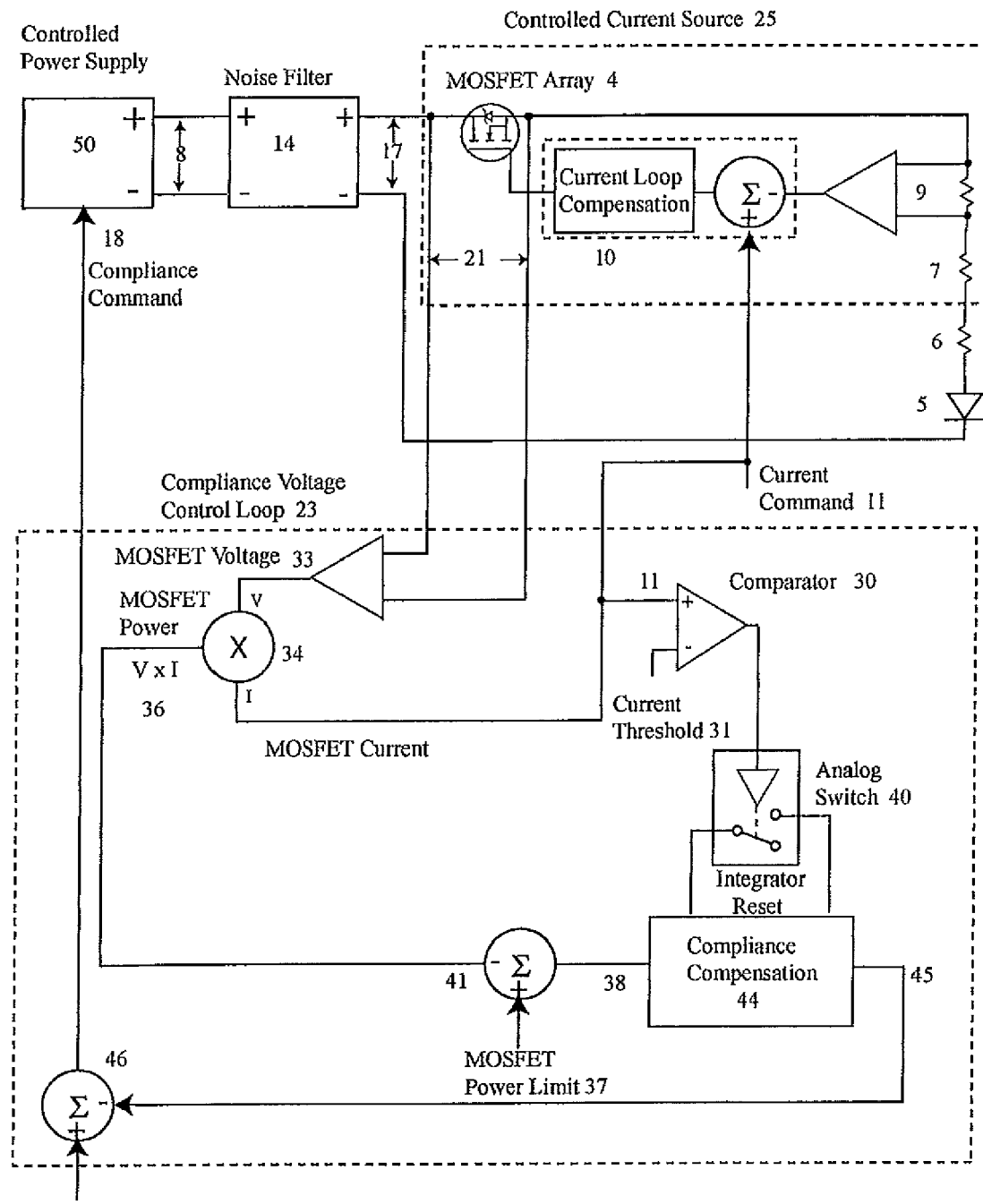
FIG. 8 is a schematic diagram of a fourth embodiment of an apparatus for implementing the present technology.

FIG. 8 describes another embodiment of the automated compliance voltage adjustment for use with a pulsed current command. It comprises many of the components defined in FIG. 7, but the action of the proportional-integral controller is modified in response to the pulsed command current waveform. Since the MOSFET passbank 4 dissipates no power during the "off" portion of the current command pulse, the integral-proportional controller 44 is reset during the "off" portion of the pulsed current command to insure that the zero-current compliance voltage is maximized at the beginning of the current pulse and is not affected by the long-term time-average of the current (over many pulses), but is only affected by the time-average of the current during the plateau portion of the pulse. Until the command current pulse has reached a predetermined threshold value 31, analog switch 40 resets the integral-proportional controller 44, maximizing the zero-current compliance voltage 8. Once the leading edge of the command current pulse exceeds a level equal to the current threshold 31, the proportional-integral controller begins to limit the time-averaged (average over the plateau time of the command pulse) value of the MOSFET power dissipation by adjusting the zero-current compliance voltage. In addition, this embodiment is useful when a constant laser diode current prebias is used. If the prebias current is set below the level of the current threshold 31, then the zero-current compliance voltage 8 will be maximized, insuring that the command current pulse is accurately reproduced. There is additional power dissipation in the MOSFET passbank during prebias, but the current threshold 31 can be set to a value such that the power dissipation during prebias current does not exceed a desired level.

While the aforementioned analog techniques for controlling the MOSFET power dissipation describe two possible embodiments, enabling this technology is not limited to these techniques which are provided only as examples. Additionally, while the use of MOSFETs is desirable in the controlled current source 25, other transistor types may be used for the resistive element 4 in the controlled current source, including but not limited to IGBT, Bipolar Junction Power or Darlington Power transistors. Further, a single semiconductor device may be used for the controlled resistive element to carry and control the entire current through the laser diode, or said current may be divided and shared amongst several semiconductor devices in the form of an array or passbank.

While the present technology is disclosed by reference to the embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. An apparatus for providing a controlled current to a laser diode comprising
    a voltage-controlled power supply providing an output voltage in response to a control command,
    a noise filter coupled to the power supply,
    a controlled current source coupled between the noise filter and the laser diode, and
    a control circuit, coupled to the voltage controlled power supply and the controlled current source, providing the control command to produce a first output voltage during a first time period resulting in a current from the current source sufficient for said laser diode followed by a second output voltage during a second time period providing a lower power dissipation in the current source wherein the controlled current source has a power dissipation, and wherein the control circuit monitors the power dissipation and adjusts said output voltage to minimize the power dissipation of the controlled current source.

2. The apparatus of claim 1 wherein the control command is of the form of a pulse having a leading edge and a plateau, and wherein said first output voltage provides sufficient energy stored within said noise filter to allow the current through said laser diode to be an accurate reproduction of the leading edge of the pulse, wherein said second output voltage provides an accurate reproduction of the plateau.

3. The apparatus of claim 2 wherein the second output voltage is lower than the first output voltage and is set after a period of time nominally equal to a time constant of the noise filter.

4. The apparatus of claim 2 wherein the control circuit provides the control command responsive to feedback circuitry measuring power dissipation of the controlled current source during the plateau.

5. The apparatus of claim 1 wherein the controlled current source contains a variable resistive element that comprises one or more MOSFETs wired substantially in parallel.

6. The apparatus of claim 1 wherein the control command has a constant DC component, and an AC component of amplitude less than 20% of the value of the DC component.

7. The apparatus of claim 1 wherein the power dissipation of the current source is limited to no greater than 10% of the power deposited in the laser diode.

8. The apparatus of claim 1 wherein a variable resistive element within the controlled current source comprises a controlled semiconductor device including, but not limited to, a MOSFET, a Bipolar Junction Transistor, a Darlington Transistor or an Insulated Gate Bipolar Junction Transistor.

9. The apparatus of claim 1 wherein the control circuit comprises an analog or digital controller.

10. The apparatus of claim 1 wherein the control circuit includes a proportional integral controller coupled responsive to a difference amplifier, the difference amplifier measuring power dissipation in the controlled current source.

11. The apparatus of claim 10 wherein the control circuit includes an integrator reset maintaining the integral controller in an off state until the current command reaches a threshold.

12. The apparatus of claim 1 wherein the control circuit comprises a switch connected to the voltage controlled power supply and a comparator, the comparator coupled to a current threshold and the current command.

13. The apparatus of claim 1 wherein the controlled current source includes a variable resistive element within the controlled current source.

14. The apparatus of claim 13 wherein the control circuit comprises
    a summing amplifier; and
    a controller monitoring power dissipated by the variable resistive element and generating the control signal which is output to the summing amplifier.

15. A method for providing a controlled current to a laser diode in a system including a controlled power supply that generates an output voltage in response to a control command and a controlled current source coupled to the power supply and the laser diode, and responsive to a current command input, the method including the steps of:
    (a) monitoring the power dissipation of the controlled current source;
    (b) setting the voltage-controlled power supply to a first output voltage during a first time period when the current command input is below a predetermined threshold;
    (c) setting the voltage-controlled power supply to a second, lower output voltage during a second time period following the first time period thereby limiting the power dissipation of the controlled current source.

16. The method of claim 15 wherein the system includes a noise filter coupled between the voltage-controlled power supply and the controlled current source, and wherein said step (c) occurs after a period of time approximately equal to the time constant of the noise filter.

17. The method of claim 15 wherein said steps (a), (b) and (c) are performed by an analog or digital controller.

18. The method of claim 15 wherein said steps (b) and (c) are performed by providing a control circuit including a proportional integral controller coupled responsive to a difference amplifier, the difference amplifier measuring power dissipation in the controlled current source.

19. The method of claim 15 wherein a variable resistive element within the controlled current source contains a semiconductor passbank comprising a multiplicity of controlled semiconductor devices including, but not limited to, a MOSFET, a Bipolar Junction Transistor, a Darlington Transistor or an Insulated Gate Bipolar Junction Transistor, and wherein said step (a) is performed by monitoring a difference between a maximum allowed MOSFET power limit and a MOSFET POWER DISSIPATION, and said step (c) is performed by generating a corrected compliance voltage as said second output voltage.

20. The apparatus of claim 13 wherein said variable resistive element contains a semiconductor passbank comprising a multiplicity of controlled semiconductor devices including, but not limited to, a MOSFET, a Bipolar Junction Transistor, a Darlington Transistor or an Insulated Gate Bipolar Junction Transistor, said devices being connected so that the total current through the controlled current source is shared between the individual controlled semiconductor devices comprising the controlled current source.

* * * * *